United States Patent [19]

Tokumitsu

[11] Patent Number: 4,845,662
[45] Date of Patent: Jul. 4, 1989

[54] DATA PROCESSOR EMPLOYING RUN-LENGTH CODING

[75] Inventor: Shigenori Tokumitsu, Fukaya, Japan

[73] Assignee: Tokyo Shibaura Denki Kabushiki Kaisha, Kawasaki, Japan

[21] Appl. No.: 77,944

[22] Filed: Jul. 27, 1987

Related U.S. Application Data

[63] Continuation of Ser. No. 549,442, Nov. 7, 1983, abandoned.

[30] Foreign Application Priority Data

Nov. 11, 1982 [JP] Japan ............................ 57-198206

[51] Int. Cl.⁴ ............................................ G06F 15/00
[52] U.S. Cl. .................................. 364/900; 358/147;
364/927.2; 364/951.1; 364/951.3
[58] Field of Search ... 364/200 MS File, 900 MS File;
358/86, 142, 146, 147, 261; 379/53, 96, 100;
381/34

[56] References Cited

U.S. PATENT DOCUMENTS

| | | | |
|---|---|---|---|
| 4,161,728 | 7/1979 | Insam | 340/750 |
| 4,191,956 | 3/1980 | Groothuls | 340/789 |
| 4,249,172 | 2/1981 | Watkins et al. | 340/726 |
| 4,328,557 | 5/1982 | Gastinel | 364/900 |
| 4,394,774 | 7/1983 | Widergren et al. | 382/56 |
| 4,412,252 | 10/1983 | Moore et al. | 358/160 |
| 4,414,645 | 11/1983 | Ryan et al. | 364/900 |
| 4,449,145 | 5/1984 | Ciciora | 358/147 |
| 4,492,983 | 1/1985 | Yoshida et al. | 358/260 |
| 4,543,612 | 9/1985 | Matsunaga et al. | 358/261 |

FOREIGN PATENT DOCUMENTS

| | | |
|---|---|---|
| 2324063 | 1/1974 | Fed. Rep. of Germany |
| 3032952 | 3/1981 | Fed. Rep. of Germany |
| 1529539 | 10/1978 | United Kingdom |

Primary Examiner—Gareth D. Shaw
Assistant Examiner—Jonathan C. Fairbanks
Attorney, Agent, or Firm—Cushman, Darby & Cushman

[57] ABSTRACT

A character data processor for a videotex or teletext system includes a microcomputer section, a self data processing unit and a read/write memory. A memory access period for the memory exists in one read/write cycle of character data packets. Data processing unit responds to a first pulse indicating the start of the memory access period and to a second pulse indicating the end of the memory access period. Data processing unit includes an address change circuit which stores initial address data and transfers address data stored therein to the memory according to a transfer pulse. The content of address data is changed by a change pulse. A data register relays data transferred between the microcomputer section and the memory. A generator circuit generates the transfer pulse, the change pulse and a clock pulse according to the generation of the first and second pulses and a detection signal. A detection circuit responds to prescribed data indicating the run length of character data. A detection circuit detects a number of times of data transfer between the microcomputer section and the memory according to the clock pulse, and generates the detection signal when the number of times of data transferring corresponds to the prescribed data.

30 Claims, 8 Drawing Sheets

DATA PROCESSOR EMPLOYING RUN-LENGTH CODING

This is a continuation of application Ser. No. 549,442, filed Nov. 7, 1983, which was abandoned upon the filing hereof.

BACKGROUND OF THE INVENTION

This invention relates to a data processor used in a videotex or teletext system and, particularly to improvement of hardware of a character data processor.

Recently a microcomputer-implemented character data processor for a teletext system has been introduced into TV receivers. In such TV receivers, it is necessary to store character data from a broadcasting station in a data memory and also to read out the stored data for character display.

In a teletext system, in order to enhance data transmission efficiency, various data compression schemes have been developed. A typical one of these schemes is a "run length coding" scheme in which the successive number of the same information ("1" or "0") is coded as run length data. Compressed character data pattern packets of the teletext system are transmitted from a broadcasting station according to the run length scheme. The broadcasting station also transmits plural units of color data representing the character data. Each unit of the color data is formed of color information and run length information of the color.

When such compressed character data is received, a teletext TV receiver repeatedly writes in a memory the same information ("1" or "0") of character data for a number designated by the run length data. A conventional approach to perform such repetitive writing is based on software. More specifically, every time when the character data is transferred to the memory, the CPU of the microcomputer checks, according to the content of an index counter, etc., whether or not the repetitive times that the same information has been written ("1" or "0") has reached the number being designated by the run length data. If this repetition has not yet reached the designated number, the succeeding same information ("1" or "0") is transferred to the next address of the memory, and the new repetitive times of the same information are compared with the designated number. Unless the repetition has reached the designated number, the CPU is restricted to performing the routine of the above repetitive writing and cannot perform the next routine. From this, the total time for handling the compressed character data tends to become long, and overall processing for a teletext character data requires a relatively long time.

SUMMARY OF THE INVENTION

It is accordingly the object of the present invention to provide a microcomputer-implemented data processor for a videotex or teletext system, which automatically performs a repeated data processing being independent of the job of a CPU of microcomputer.

Figure 2:
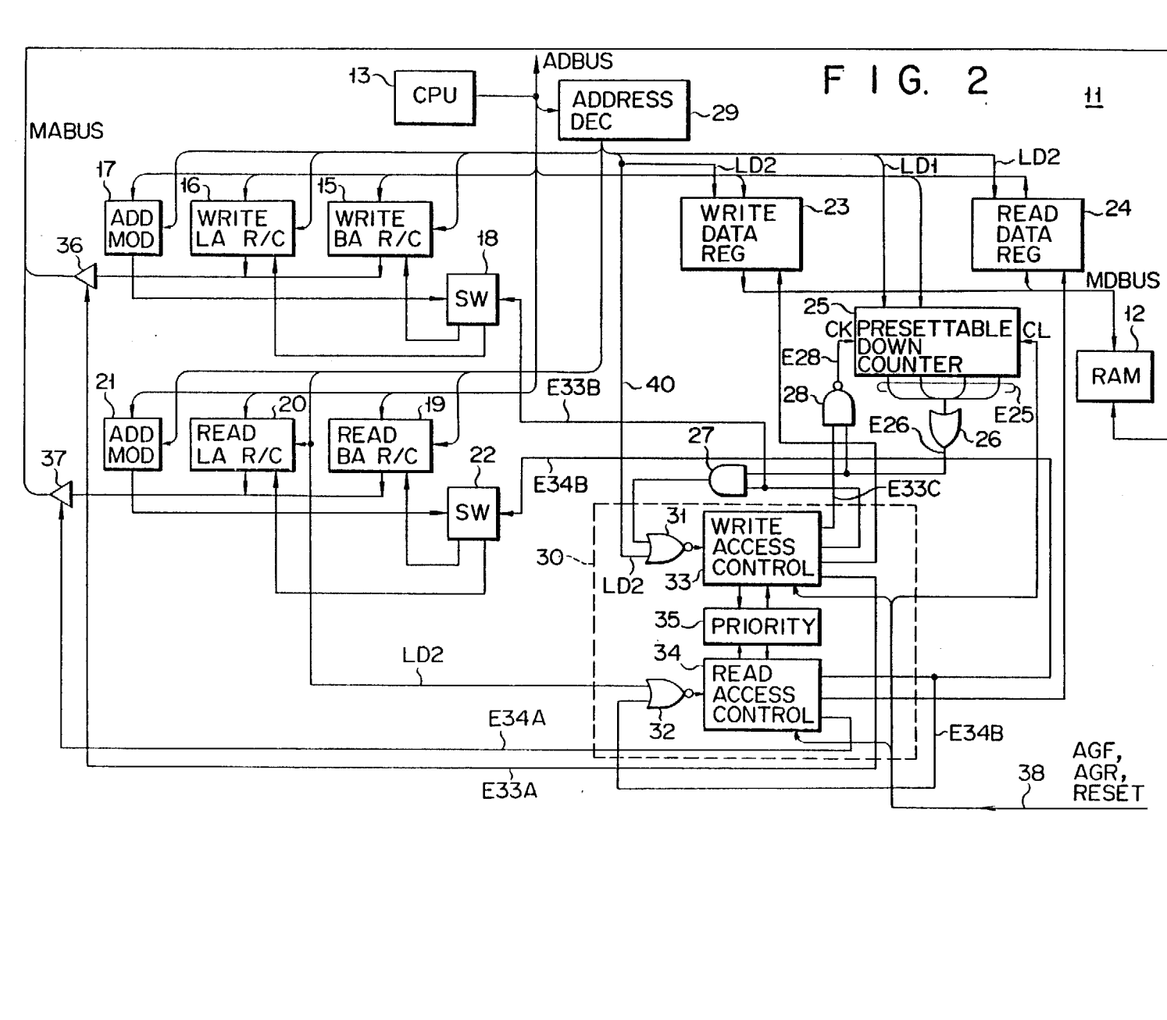
FIG. 2 is a block diagram showing the configuration of the self data processing unit (11) of FIG. 1.

To achieve the above object, as seen from FIG. 2, a data processor according to the present invention includes means (15 to 22, 36, 37) for automatically incrementing the address number of a memory (12), means (23, 24) provided between the memory (12) and a CPU (13) for relaying data to be transferred between them (12, 13), means (25, 26) for detecting the number of repetitions of successive writing of a same data bit for the memory (12), and means (30) for generating timing pulses which are supplied, in accordance with a pulse AGF indicating the start of the access period and a pulse AGR indicating the end of the access period, to the incrementing means (15 to 22, 36, 37), to the relaying means (23, 24) and to the detecting means (25, 26).

According to the above configuration, repetitive data transferring operation between a CPU and a memory can be controlled by the hardware of the data processor, not by a software program. From this, the CPU is free from the control of repetitive data transfer, resulting in a simple software program and high speed operation of character data processing.

DETAILED DESCRIPTION OF THE PREFERRED EMBODIMENT

An embodiment of the present invention will be described in detail with reference to the accompanying drawings.

Figure 1:
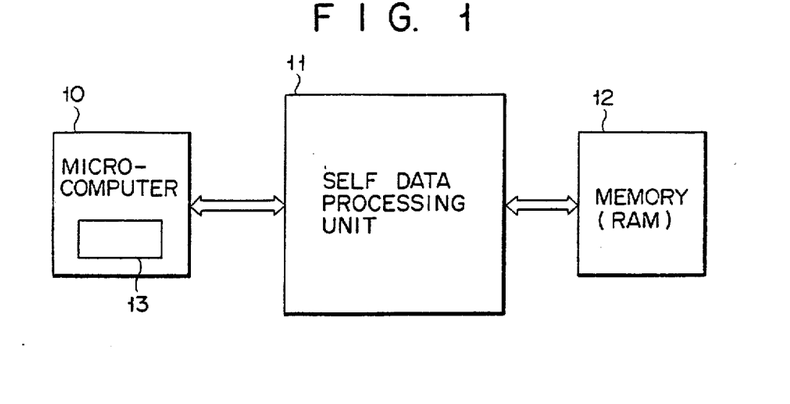
FIG. 1 is a schematic block configuration of a microcomputer-implemented character data processor of a teletext or videotex system.

FIG. 1 shows a schematic configuration of a microcomputer-implemented character data processor of a teletext (or videotex) system. This processor is formed of a microcomputer section 10 including a central processing unit (CPU 13, a self data processing unit 1 and a read/write memory or random access memory (RAM) 12. In a character data processor of the invention, there are two types of data processing. One is data processing based on software being formed of a macroprogram which is alterable by users. The other is a self data processing based on a prescribed sequence of discrete hardware which is not alterable by users. In the self data processing, CPU 13 merely instructs the loading of repetitive data (run length data) and the start of the self data processing.

The self data processing on it is performed by self data processing unit 11. An important feature of the invention resides in the data write operation for memory 12 when the self data processing is executed. The processing unit 11 may be circuit-integrated individually or together with the microcomputer section 10.

FIG. 2 shows the configuration of self data processing unit 11. FIGS. 3A to 3E show a timing chart illustrating the relation between access time of unit 11 and access time of memory (RAM) 12. The access time of unit 11 is required to store data in RAM 12, and the access time of RAM 12 is required to read out the stored data for character display.

Figures 3A, 3B:
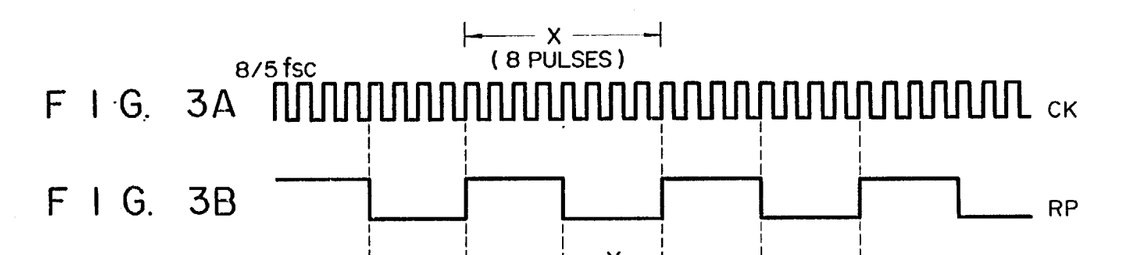
FIGS. 3A, 3B, 3C, 3D and 3E show a timing chart explaining the access period (Y) of the self data processing unit (11) of FIG. 2.

The access time of self data processing unit 11 will be described with reference to the timing chart of FIGS. 3A to 3E. FIG. 3A shows a basic clock CK having 8/5 fsc (fsc being a chrominance subcarrier frequency). One pulse of basic clock CK corresponds to one bit of image data (character data) to be displayed. Each data unit which is formed of parallel 8 bits (one byte) data read out from RAM 12, is parallel-to-serial converted for CRT display, according to basic clock CK. In the reading operation, 8-bit parallel data is read out from RAM 12 in response to one read pulse RP, and the read-out parallel data is converted to 8-bit serial data. Thus, read pulse RP may be supplied to RAM 12 each for a period corresponding to 8 bits of the serial data. Namely, as seen from FIGS. 3A and 3B, one read cycle period X is set for every 8 pulses of 8/5 fsc basic clock CK, or for every 8-bit data, and 8 bits of display data are read out during this period X. This construction permits providing a free area Y for access as shown by the dashed line in FIG. 3C. The present invention utilizes the period of this free area Y so that the self data processing unit 11 can access RAM 12 during this period (Y).

Figure 3C:
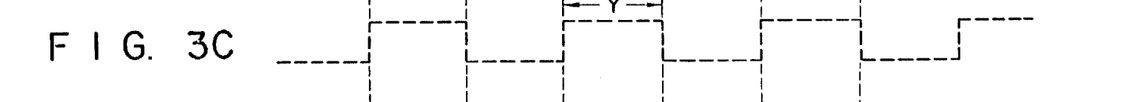
Figure 3D:
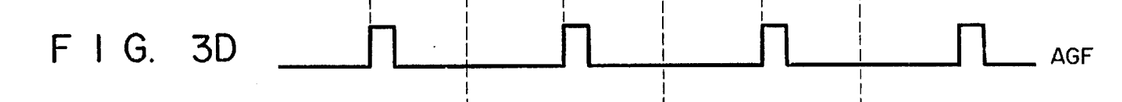
Figure 3E:
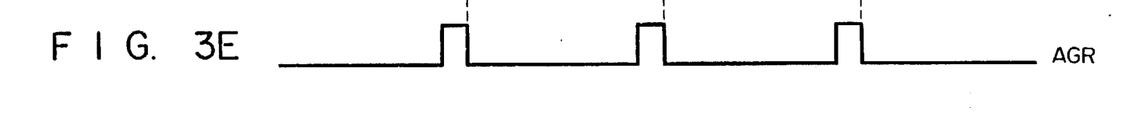

The access period (Y) shown in FIG. 3C is utilized for automatic data writing of the RAM 12. To detect this access period (Y), a pulse AGF indicating the front or start point of free area Y and a pulse AGR indicating the rear or end point of free area Y are employed. The leading edge of pulse AGF appears at the front edge of free area Y (FIG. 3D) and the trailing edge of pulse AGR appears at the rear edge of free area Y (FIG. 3E). During the access period of free area Y, CPU 13 does not access the RAM 12 directly, but CPU 13 merely transfers data to RAM 12.

Incidentally, circuit configurations for generating the pulses CK, RP, AGF and AGR will be described later with reference to FIGS. 7 and 8. Such circuit configurations may be incorporated in the configuration of self data processing unit 11.

A detailed configuration of self data processing unit 11 is shown in FIG. 2. The description regarding this configuration will be given in a case where the same data (e.g., all "1s") are repeatedly written in RAM 12. CPU 13 is coupled to an address data bus ADBUS. CPU 13 can supply address data via this bus ADBUS to a byte address register/counter 15 for writing, a line address register/counter 16 for writing, a byte address register/counter 19 for reading and a line address register/counter 20 for reading. Bus ADBUS also serves as a read/write data bus for transferring write data form CPU 13 to RAM 12 or for transferring read data from RAM 12 to CPU13. Further, CPU 13 supplies a sequence control signal to an address decoder 29 via bus ADBUS. Address decoder 29 supplies timing signals to circuit elements 15 to 17, 19 to 21, 23 to 25 and 30 according to the sequence control signal, so that any overlapping of data of the above circuit elements on the bus ADBUS is avoided.

CPU 13 can preset count data to down counter 25 via bus ADBUS. As will be described later in detail, down counter 25 serves to detect the number of times of the repeated same data writing for the RAM 12. Counter 25 down-counts a clock signal (E28) upon completion of every data processing. When the content (counted number) of counter 25 coincides with the present value, counter 25 supplies a specific count output E25 to an OR gate 26 so that OR gate 26 generates a detection signal E26.

Byte address register/counter 15 and line address register/counter 16 are coupled via a buffer 36 and a memory address bus MABUS to the RAM 12. Byte address register/counter 19 and line address register/counter 20 are coupled via a buffer 37 and bus MABUS to RAM 12. Register/counters 15 and 16 for writing and register/counters 19 and 20 for reading respectively have automatic increment function for automatically incrementing address data supplied thereto. The circuitry of writing register/counters 15 and 16 is provided with an add mode setting register 17 and add switching circuit 18 for increment function. The circuitry of reading register/counters 19 and 20 is provided with an add mode setting register 21 and add switching circuit 22 for the increment function.

The above automatic increment function will be described in conjunction with a case where the write address data for RAM 12 is incremented. When data to be written in RAM 12 is data for displaying a horizontal line on a screen, logic "1" is set in add mode setting register 17. In this case, add switching circuit 18 responds to the logic "1" from register 17 and renders the register/counter 15 such that the content of register/counter 15 is incremented by "+1" every time when one data writing in RAM 12 is completed. Thus, the content of register/counter 15 is automatically incremented one by one for each data writing. This means that CPU 13 should set only an initial address data in register/counter 15 but no succeeding address data setting is required for CPU 13.

When data to be written in RAM 12 is vertical writing data, logic "0" is set in add mode setting register 17. In this case, add switching circuit 18 responds to the logic "0" from register 17 and renders the register/counter 16 such that the content of register/counter 16 is incremented by "+1" every time when one data writing in RAM 12 is completed. Thus, the content of register/counter 16 is automatically incremented one by one for each data writing. This means that CPU 13 should set only an initial address data in register/counter 16 but no succeeding address data setting is required for CPU 13.

When data to be read out from RAM 12 is data for displaying a horizontal line on a screen, logic "1" is set in add mode setting register 21. In this case, add switching circuit 22 responds to the logic "1" from register 21 and renders the register/counter 19 such that the content of register/counter 19 is incremented by "+1" every time when one data reading from RAM 12 is completed. Thus, the content of register/counter 19 is automatically incremented one by one for each data reading.

When data to be read out from RAM 12 is vertical reading data, logic "0" is set in add mode setting register 21. In this case, add switching circuit 22 responds to the logic "0" from register 21 and renders the register/counter 20 such that the content of register/counter 20 is incremented by "+1" every time when one data reading in RAM 12 is completed. Thus, the content of register/counter 20 is automatically incremented one by one for each data reading.

Thus, the circuit elements 19 to 22 for reading operate similarly to the above circuit elements 15 to 18 for writing, and have a similar automatic increment function.

As mentioned above, since the register/counters 15, 16, 19 and 20 have an automatic increment function, CPU 13 does not require a software routine to perform the incrementing operation of register/counters 15, 16, 19 and 20.

The data line of RAM 12 is coupled via a memory data bus MDBUS to write data register 23 and to read data register 24.

Pulses AGF, AGR and RESET are supplied via signal line 38 to down counter 25, write access controller 33 and read access controller 34. Controllers 33, 34 together with NOR gates 31, 32 and a priority circuit 35 constitute a self data processing sequencer 30. Sequencer 30 generates timing pulses within the period of free area Y based on the pulses AGF and AGR (Figs. 3C to 3E). For instance, when any given data is preset in counter 25, OR gate 26 generates detection signal E26 and this signal E26 is supplied via an AND gate 27 and a NOR gate 31 to write access controller 33. Then, controller 33 supplies one of said timing pulses to a NAND gate 28, and NAND gate 28 supplies said clock signal E28 to down counter 25.

When data from CPU 13 is written in RAM 12, the configuration of FIG. 2 will operate as follows. Firstly, CPU 13 transfers address data indicating the write address of RAM 12 to register/counters 15 and 16. Then, CPU 13 transfers write data to be written in RAM 12 to write data register 23. A pulse (LD2) indicating the write data transfer is supplied via a signal line 40 to NOR gate 31. Write access controller 33 detects the timing of this write data transfer by the pulse (LD2) on line 40. Immediately after the detection of this write data transfer, controller 33 determines the access period of free area Y according to pulses AGF and AGR. Within this access period, the address data from register/counter 15 or 16 is supplied via buffer 36 and bus MABUS to RAM 12 and the write data is supplied via bus MDBUS to RAM 12.

After completion of the data transfer to RAM 12, an increment pulse for incrementing the content of register/counter 15 or 16 is supplied from controller 33 to add switching circuit 18. Circuit 18 supplies the increment pulse to either of register/counters 15 and 16 according to the logic level ("1" or "0") of add mode setting register 17. When circuit 18 supplies the increment pulse to register/counter 15, the content of register/counter 15 is incremented by, e.g., +32 (horizontal direction in the screen). When circuit 18 supplies the increment pulse to register/counter 16, the content of register/counter 16 is incremented by, e.g., +1 (vertical direction in the screen). According to the configuration of FIG. 2, since the address data for RAM 12 is automatically incremented, it is only necessary for CPU 13 that CPU 13 sets initial data in the register/counters 15, 16, 19 and 20.

The operation of the configuration of FIG. 2 when data is read out from RAM 12 to CPU 13 is similar to the above-mentioned data write operation, and therefore the description thereof is omitted.

As mentioned above, CPU 13 does not directly access the RAM 12 but indirectly accesses it through address register/counter 15, 16, 19 or 20 and data register 23 or 24. Incidentally, such an indirect access is not always carried out during all access periods of free area Y (FIG. 3C). Such an indirect access will be performed immediately after the completion of data setting for the register/counters and during one or more proper periods of free area Y.

Now the description will be given to the successive write operation of the same repeated data, which is a key portion of the present invention.

Firstly, initial address data for the successive write operation is transferred from CPU 13 to byte address register/counter 15 for writing and to line address register/counter 16 for writing. Secondly, CPU 13 presents data representing the number of times of repeated writing in down counter 25. Finally, data to be written in RAM 12 is loaded in write data register 23. After this data loading, a necessary number of access periods for the successive data writing are automatically prepared, and the same repeated data is written in RAM 12. At this time the write address is automatically incremented every time the repeated data is written in RAM 12.

Figure 4:
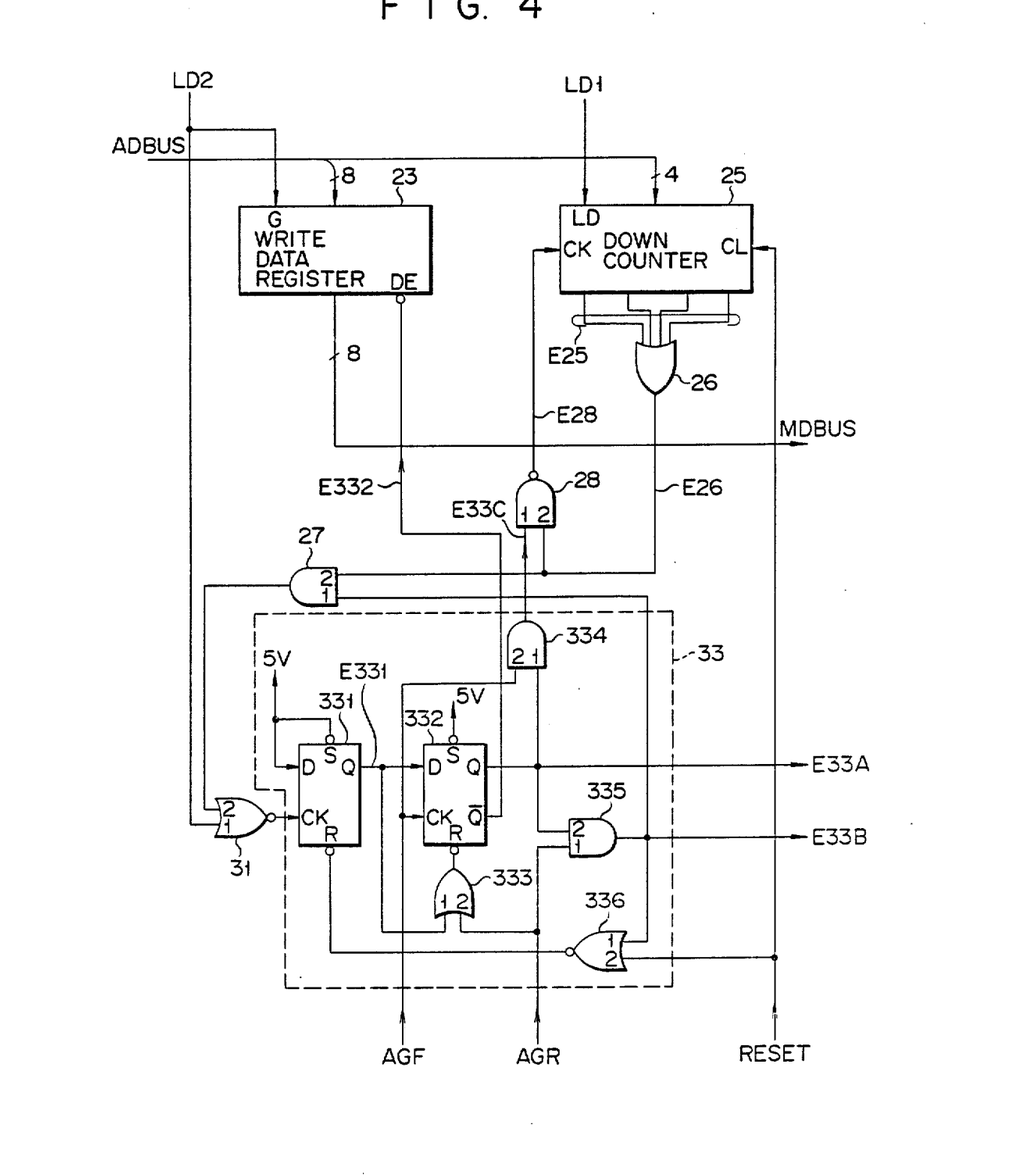
FIG. 4 shows details of the write access controller (33) of FIG. 2.

The above successive write operation is controlled by write access controller 33. FIG. 4 shows a detailed configuration of the controller 33. In FIG. 4, priority circuit 35 is omitted for simplicity. FIGS. 5A to 5I illustrate a timing chart for explaining the operation of controller 33 wherein the successive number of the same data (run length) is "2".

The successive number data "decimal 2" (binary 4 bits) is inputted to down counter 25 via bus ADBUS. When counter 25 receives at its load input a successive number loading pulse LD1 (FIG. 5A) from address decoder 29, the data "2" is present in counter 25 and the content or count output E25 of counter 25 is changed from "0" to "2" (T10 in FIG. 5B). This count output E25 is inputted to an OR gate 26. Then, the logic level of a detection signal E26 outputted from OR gate 26 is changed from "0" to "1" (t10 in FIG. 5C).

Write data (binary 8 bits) is supplied from CPU 13 to write data register 23 via bus ADBUS. When register 23 receives a data loading pulse LD2 (FIG. 5F) from address decoder 29, the write data is loaded in register 23.

Data loading pulse LD2 is supplied via the first input of a NOR gate 31 to the clock input of a D flip-flop 331 whose D input receives a fixed potential of 5 V corresponding to logic level "1". When flip-flop 331 is clocked by loading pulse LD2, a Q output E331 from flip-flop 331 becomes logic "1". Q output E331 is supplied to the D input of a D flip-flop 332 and to the first input of an OR gate 333. Flip-flop 332 is reset through OR gate 333 by Q output E331. Under this state, when flip-flop 332 is clocked by the leading edge of pulse AGF (t12 in FIG. 5D), a Q output E33A of flip-flop 332 becomes logic "1" and an inverted Q output E332 thereof becomes logic "0".

Q output E33A is supplied as one of the timing pulses of sequencer 30 to buffer 36 shown in FIG. 2. Buffer 36 is so enabled by the logic "1" of Q output E33A that write address data from writing register/counter 15 or 16 is supplied via bus MABUS to RAM 12. Q output E33A is supplied to the first input of an AND gate 334 whose second input receives pulse AGF. AND gate 334 supplies a timing pulse E33C to the first input of a NAND gate 28 whose second input receives detection signal E26. NAND gate 28 supplies a clock pulse E28 to the clock input of down counter 25 (t12 in FIG. 5H). Counter 25 down-counts the pulse E28 and the content (count output E25) of counter 25 is decremented by one at the rising edge of clock pulse E28, i.e., the count output E25 is changed from "decimal 2" to "decimal 1" (t14 in FIG. 5B).

Inverted Q output E332 from flip-flop 332 is supplied to the data enable input of write data register 23. Write data (8 bits) loaded in register 23 is then transferred to RAM 12 via bus MDBUS, and the transferred data is written in a specific address of RAM 12 which is designated by the address data on bus MABUS.

Pulse AGR is supplied to the first input of an AND gate 335 whose second input receives timing pulse E33A. AND gate 335 outputs a timing pulse E33B corresponding to the logical AND of pulses AGR and E33A (t16 in FIGS. 5, 5G and 5I). Pulse AGR is also supplied to the reset input of flip-flop 332 via the second input of OR gate 333. Flip-flop 332 is reset by the trailing edge of pulse AGR, and the logic level of timing pulse E33A from the Q output of flip-flop 332 is changed from "1" to "0" (t18 in FIGS. 5E and 5G). Timing pulse E33B is supplied as an address increment pulse to add switching circuit 18 of FIG. 2. Automatic increment of the write address data for RAM 12 is performed according to this pulse E33B.

Timing pulse E33B is supplied via the first input of a NOR gate 336 to the reset input of flip-flop 331. Pulse E33B is also supplied to the first input of an AND gate 27 whose second input receives detection signal E26 having logic "1" level (t16 in FIGS. 5C and 5I). Thus, pulse E33B is passed through AND gate 27 and supplied via the second input of NOR gate 31 to the clock input of flip-flop 331. Flip-flop 331 is reset by the leading edge of pulse E33B but, immediately after this resetting, flip-flop 331 is again clocked by the trailing edge of pulse E33B. Accordingly, logic level "1" of Q output E331 is retained.

Timing pulse E33A obtained by the above-mentioned operation defines the access period of free area Y shown in FIG. 3C. The operation for obtaining such timing pulse E33A is repeated unless the logic level of detection signal E26 becomes "0".

Figures 5A, 5B:
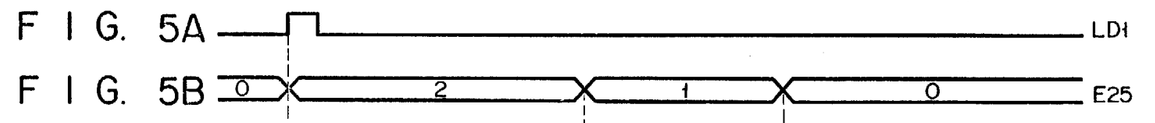
FIGS. 5A, 5B, 5C, 5D, 5E, 5F, 5G, 5H and 5I show a timing chart explaining the successive data write operation of FIG. 4.
Figures 5C, 5D, 5E:
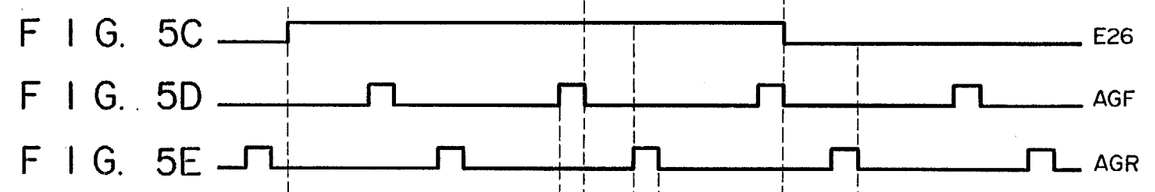
Figures 5F, 5G:
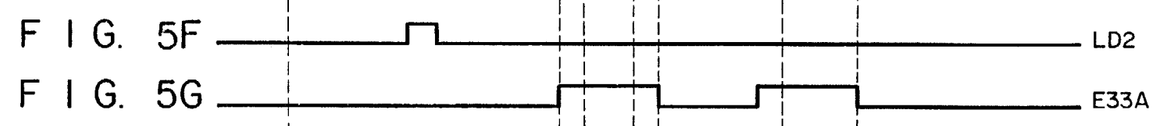
Figures 5H, 5I:
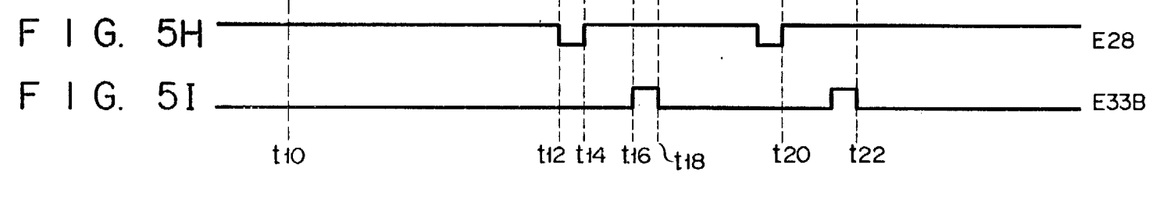

When timing pulse E33A is twice generated, the content (E25) of down counter 25 is changed from "decimal 1" to "decimal 0" at the rising edge of clock pulse E28 (t20 in FIGS. 5B, 5G and 5H), and the logic level of detection signal E26 is changed from "1" to "0" (t20 in FIG. 5C). This level change indicates that the repeated data writing in RAM 12 is completed. When the logic level of signal E26 is "0", timing pulse E33B is blocked by AND gate 27 and, therefore, flip-flop 331 is not clocked by pulse E33B. Accordingly, after flip-flops 331 and 332 are reset by pulses AGR and E33B under E26≈"0" (t22 in FIGS. 5C, 5E and 5I), the operational condition of FIG. 4 circuit is returned to that before time t10 of FIGS. 5A to 5I.

Incidentally, counter 25 and flip-flop 331 are reset by pulse RESET at the initial stage of the circuit operation. Pulse REST may be generated at the time of, e.g., POWER ON of the character data processor.

According to the above operation, if the successive number of data loaded into down counter 25 is "N", i.e., the run length of the same data is "N", the timing pulse E33B for accessing RAM 12 is generated N times and N-time automatic increment operation for writing the N same data is performed.

Figure 6:
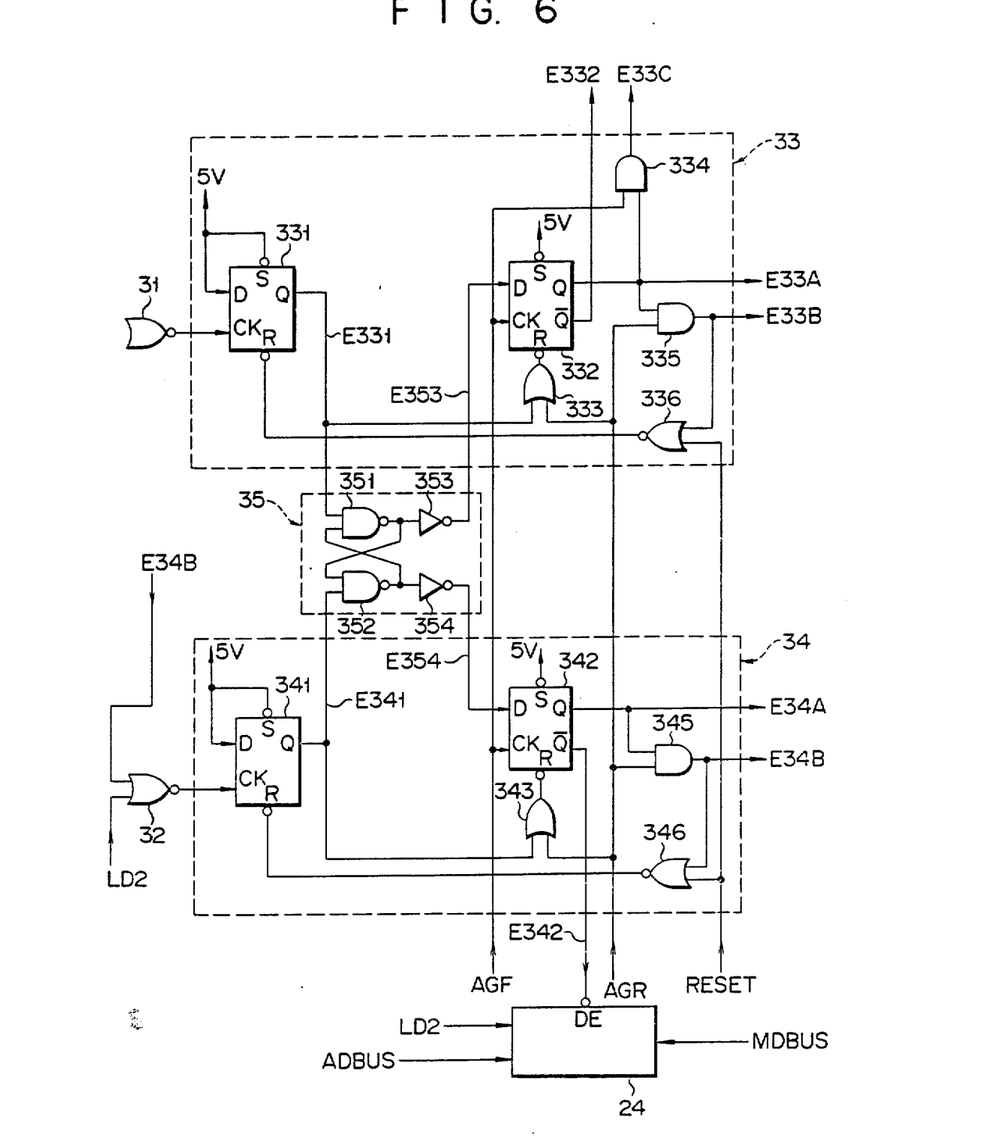
FIG. 6 shows details of the read access controller (34) of FIG. 2.

The read operation is controlled by read access controller 34 according to the program of CPU 13. FIG. 6 shows detailed configuration of the controller 34 and priority circuit 35.

Read data from RAM 12 is supplied to read data register 24 via bus MDBUS. When register 24 receives a data loading pulse LD2 from address decoder 29, the read data is loaded in register 24. Data loading pulse LD 2 is supplied via the first input of a NOR gate 32 to the clock input of a flip-flop 341 whose D input receives a fixed potential of 5 V corresponding to logic level "1". When flip-flop 341 is clocked by loading pulse LD2, a Q output E341 from flip-flop 341 becomes logic "1". Q output E341 is supplied via a NAND gate 352 and an inverter 354 to the D input of a D flip-flop 342. Q output E341 is also supplied to the first input of an OR gate 343.

Here, Q output E331 from flip-flop 331 of controller 33 is supplied via a NAND gate 351 and an inverter 353 to the D input of flip-flop 332. NAND gates 351 and 352 are cross-coupled to form a bistable flip-flop circuit. NAND gates 351, 352 and inverters 353, 354 constitute the priority circuit 35. When Q output E331 becomes logic "1" before Q output E341 becomes logic "1", circuit 35 blocks the output E341 and passes the output E331 as a D input signal E353 for flip-flop 332. On the other hand, when Q output E341 becomes logic "1" before Q output E331 becomes logic "1", circuit 35 blocks the output E331 and passes the output E341 as a D input signal E354 for flip-flop 342. Signal E354 is supplied to the D input of flip-flop 342. Flip-flop 342 is reset through OR gate 343 by Q output E341. Under this state, when flip-flop 342 is clocked by the leading edge of pulse AGF, a Q output E34A of flip-flop 342 becomes logic "1" and an inverted Q output E342 thereof becomes logic "0".

Q output E34A is supplied as one of the timing pulses of sequencer 30 to buffer 37 shown in FIG. 2. Buffer 37 is so enabled by the logic "1" of Q output E34A that read address data from reading register/counter 19 or 20 is supplied via bus MABUS to RAM 12. Inverted A output E342 from flip-flop 342 is supplied to the data enable input of read data register 24. Read data stored in a specific address of RAM 12, which address is designated by the address data on bus MABUS, is then transferred from RAM 12 to register 24 via bus MDBUS.

Pulse AGR is supplied to the first input of an AND gate 345 whose second input receives timing pulse E34A. AND gate 345 outputs a timing pulse E34B corresponding to the logical AND of pulses AGR and E34A. Pulse AGR is also supplied to the reset input of flip-flop 342 via the second input of OR gate 343. Flip-flop 342 is reset by the trailing edge of pulse AGR, and the logic level of timing pulse E34A from the Q output of flip-flop 342 is changed from "1" to "0". Timing pulse E34B is supplied as an address increment pulse to add switching circuit 22 of FIG. 2.

Timing pulse E34B is supplied via the first input of a NOR gate 346 to the reset input of flip-flop 341. Pulse E34B is also supplied via the second input of NOR gate 32 to the clock input of flip-flop 341. Flip-flop 341 is reset by the leading edge of pulse E34B but, immediately after this resetting, flip-flop 341 is again clocked by the trailing edge of pulse E34B. Accordingly, logic level "1" of Q output E341 is retained.

Figure 7:
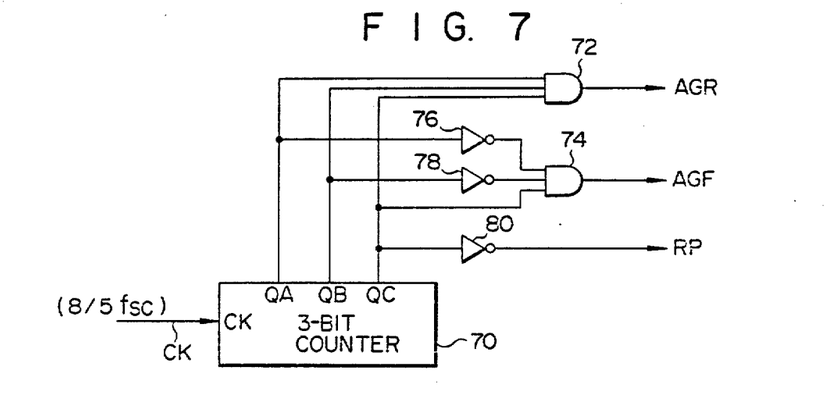
FIG. 7 shows a circuit configuration of a pulse generator for generating pulses AGF, AGR and RP.
Figures 8A, 8B:
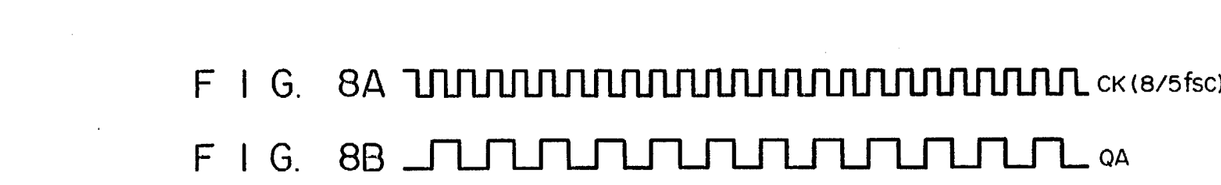
FIGS. 8A, 8B, 8C, 8D, 8E, 8F and 8G show a timing chart explaining the circuit operation of FIG. 7.
Figure 8C:
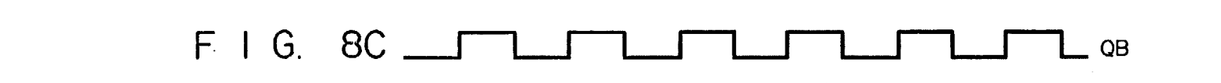
Figure 8D:
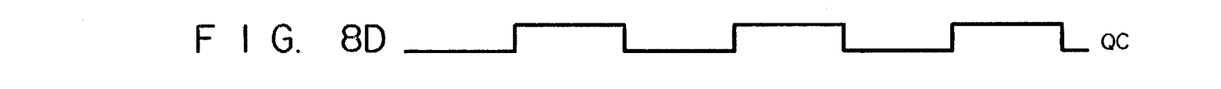
Figure 8E:
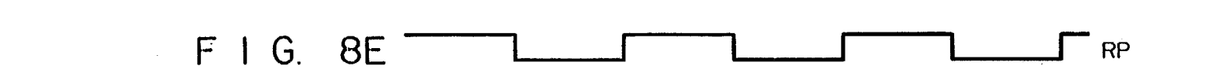
Figure 8F:
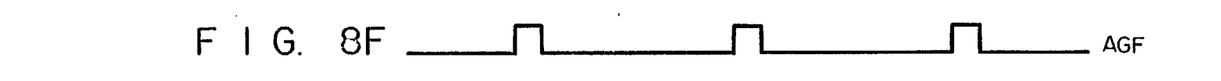
Figure 8G:
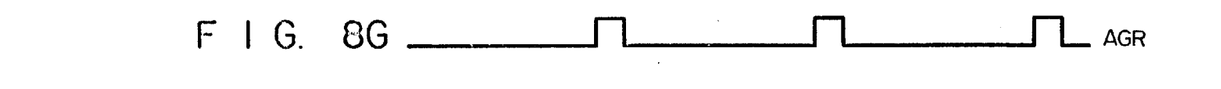

FIG. 7 shows a pulse generator for generating the pulses AGF, AGR and RP. FIGS. 8A to 8G show a timing chart illustrating the operation of the pulse generator of FIG. 7. A 8/5 fsc basic clock CK (FIG. 8A) is supplied to a clock input of a 3-bit ring counter 70. 3-bit outputs QA, AB and QC (FIGS. 8B to 8D) are supplied to a three-input AND gate 72. AND gate 72 provides pulse AGR (FIG. 8G) corresponding to the logical AND of outputs QA, QB and QC. Output QA is supplied via an inverter 76 to the first input of an AND gate 74. Output QB is supplied via an inverter 78 to the second input of AND gate 74 whose third input receives output QC. AND gate 74 provides pulse AGF (FIG. 8F) corresponding to the logical AND of inverted QA, inverted QB and QC. Output QC is changed to pulse RP (FIG. 8E) via an inverter 80.

Figure 9:
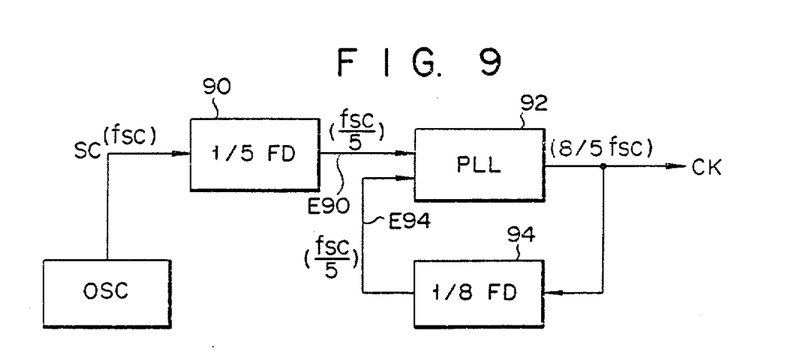
FIG. 9 shows a configuration of a basic clock generator for generating a basic clock pulse CK (8/5 fsc) shown in FIG. 7.

FIG. 9 shows a basic clock generator for generating the basis clock CK. A color subcarrier signal SC having a subcarrier frequency fsc is 1/5 frequency divided by a frequency divider 90. Divider 90 supplies a 1/5 fsc signal E90 to a PLL (phase locked loop) circuit 92 which may be a conventional one. For instance, # NE564 manufactured by Signatics Co., USA may be used for PLL circuit 92. PLL 92 receives a feedback signal E94 having 1/5 fsc frequency, and generates the 8/5 fsc basic clock CK. This clock CK is converted to the feedback signal E94 by a 1/8 frequency divider 94. PLL 92 operates such that the phase difference between signals E90 and E94 becomes minimum. Then, 8/5 fsc basic clock CK being exactly synchronized to color subcarrier signal SC is obtained.

Figure 10:
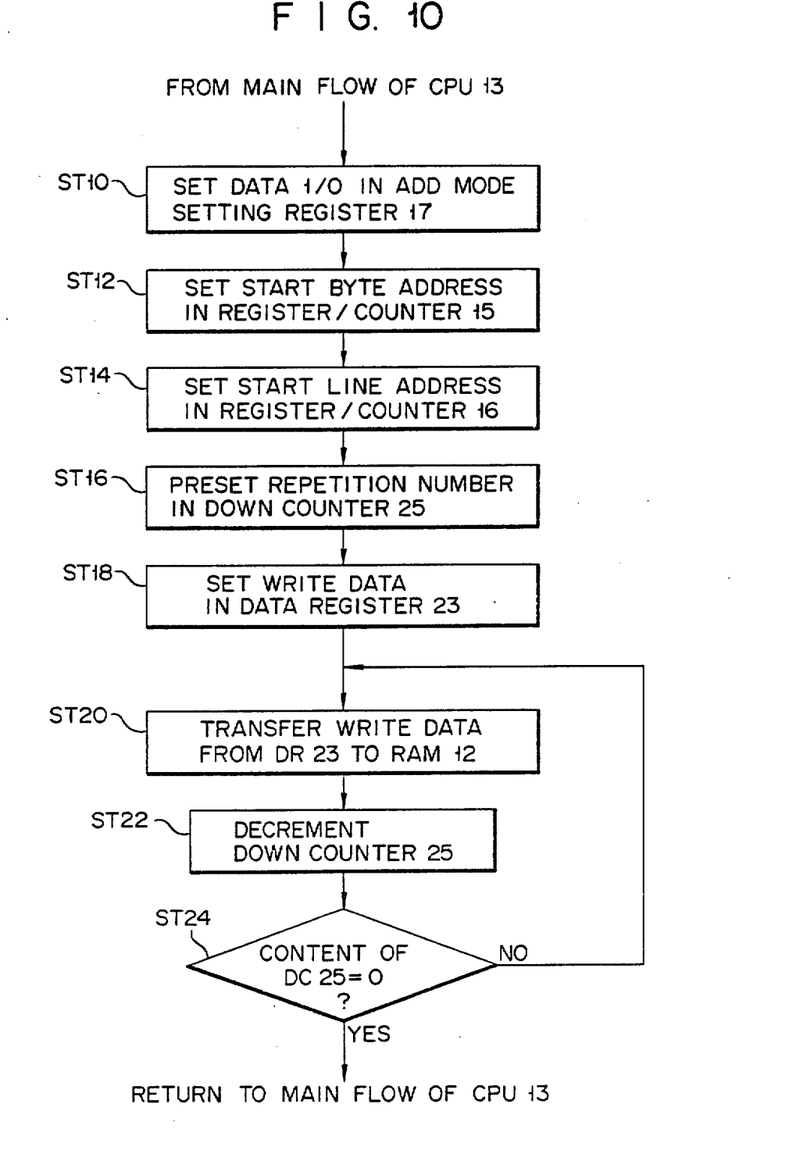
FIG. 10 shows a flow chart explaining the automatic writing operation of FIG. 2.

FIG. 10 shows a flow chart briefly explaining the automatic successive writing operation of FIG. 2. After CPU 13 receives read pulse RP, the main flow of software program enters the flow of FIG. 10. One bit data "1" indicating the horizontal writing or one bit data "0" indicating the vertical writing is set in add mode setting register 17 (ST10). The start byte address data is set in byte address register/counter 15 (ST12). The start line address data is set in line address register/counter 16 (ST14). The repetition number data indicating the run length of write data to be written in RAM 12 is preset in down counter 25 (ST16). The write data is set in data register 23 (ST18). The write data is transferred from data register 23 to RAM 12 (ST20). The content of down counter 25 is decremented by one (ST22). The content of counter 25 is compared with a prescribed data "zero". If the content is not zero (NO in ST24; logic "1" of signal E26 in FIG. 5C), the flow is returned to ST20, and the loop of steps ST20 to ST24 is repeated. If the content is zero (YES in ST24; logic "0" is signal E25 in FIG. 5C), the flow is returned to the next software sequence of CPU 13. In FIG. 10, steps ST10 to ST18 are the part of software of CPU 13, while steps ST20 to ST24 are the part of hardware of self data processing unit 11 shown in FIG. 2.

The present invention is not limited to the particular embodiment described herein and illustrated in the accompanying drawings. Various changes and modifications may be made within the scope of the present invention. For example, data processing times detecting means (25 and 26 in FIG. 2) may be formed of registers, up or down counters and a prescribed data detecting circuit (coincidence sensor). Further, the character data processor of the invention may be used or combined with a data processing circuit disclosed in the Japanese Patent Applications No. 57-130245 and No. 57-130246. All disclosures of these Japanese Patent Applications are now incorporated herewith.

As described in the foregoing, according to the present invention, once initial address data is set in write address register/counters, and write data and run length data are set in write data register and down counter, respectively, subsequent processing of data transfer from CPU 13 to RAM 12 can be automatically performed for the designated number of times. Thus, no software intervention in the detailed procedure of repeated data transferring is needed. Accordingly, it is possible to greatly reduce the program steps of CPU 13, and time required for data transfer processing can be effectively reduced by the automatic address incrementing operation of hardware. Further, even where data stored in RAM 12 is being handled for other purposes such as display and writing under the program control of CPU 13, any other processing can be executed by making use of the free area Y of FIG. 3C and it is possible to expand the function of microcomputer section 10. The data processor according to the present invention is therefore very advantageous to a teletext or videotex system.

What is claimed is:

1. A data processor for processing compressed-coded character data packets supplied externally to the data processor to be displayed thereby at a display area which is horizontally or vertically successive, said data processor including a microcomputer section, a data processing unit, and a read/write memory for storing video information, said data processing unit comprising:
    data register means for receiving write data to be written into said memory from said microcomputer section and storing said data, and for transferring the stored write data to said memory in response to a write pulse;
    address generator means for receiving initial address data from said microcomputer section, and for generating address data based on said initial address data, the generated address data being used for defining an initial writing address for said write data in said memory;
    address changing means, coupled to said address generator means, for changing the generated address data generated by said address generator means to form changed address data which is successive with respect to said horizontally or vertically successive display area of said compressed-coded character data, and for transferring the changed address data to said memory, in response to a transfer pulse;
    means or determining a free memory access period during which said data is not being read from said memory to be displayed;
    write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during said free memory access period; and
    writing-number detection means, coupled to said write-enable means and to receive prescribed data indicating a successive length of said write data to be displayed from said microcomputer section, and responsive to said prescribed data indicating a successive length of the write data to be displayed, for detecting a number of repetitions of successive writing in said memory of a same data, and stopping the writing of said same data when the detected number of repetitions corresponds to said prescribed data.

2. A processor according to claim 1, wherein said writing-number detection means includes:
    counter means, coupled to said microcomputer section and said write-enable means, connected to receive said prescribed data from said microcomputer section, for counting a number of repetitions of said successive same-data writing, generating a detection signal indicating the end of the repetitive same-data writing when the number of the counting reaches a value corresponding to said prescribed data, and supplying said detection signal to said write-enable means, so that the generation of said write pulse is stopped.

3. A processor according to claim 1, further comprising:
pulse generating means, coupled to said memory access period determining means and said write-enable means, for generating a first pulse indicating a start of said free memory access period, and a second pulse indicating an end of said free memory access period.

4. A data processor for processing compressed-coded character data packets supplied externally to the data processor to be displayed thereby at a display area which is horizontally or vertically successive, said data processor including a microcomputer section, a data processing unit, and a read/write memory for storing video information, said data processing unit comprising:
data register means for receiving write data to be written into said memory from said microcomputer section and storing said data, and for transferring the stored write data to said memory in response to a write pulse;
address generator means for receiving initial address data from said microcomputer section, and for generating address data based on said initial address data, the generated address data being used for defining an initial writing address for said write data in said memory;
address changing means, coupled to said address generator means, for changing the generated address data generated by said address generator means to form changed address data which is successive with respect to said display area of said compressed-coded character data, and for transferring the changed address data to said memory, in response to a transfer pulse;
means for determining a free memory access period during which said data is not being read from said memory to be displayed;
write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during said free memory access period;
writing-number detection means, coupled to said write-enable means and to receive prescribed data indicating a successive length of said write data to be displayed from said microcomputer section, and responsive to said prescribed data indicating a successive length of the write data to be displayed, for detecting a number of repetitions of successive writing in said memory of a same data, and stopping the writing of said same data when the detected number of repetitions corresponds to said prescribed data; and pulse generating means, coupled to said memory access period determining means and said write-enable means, for generating a first pulse indicating a start of said free memory access period, and a second pulse indicating an end of said free memory access period;
wherein leading and training edges of said transfer pulse are determined based on said first and second pulses, respectively, and said free memory access period is defined by said leading and training edges of said transfer pulse.

5. A data processor for processing compressed-coded character data packets supplied externally to the data processor to be displayed thereby at a display area, said data processor including a microcomputer section, a data processing unit, and a read/write memory for storing video information, said data processing unit comprising:
data register means for storing write data to be written into said memory supplied from said microcomputer section, and for transferring the stored write data to said memory in response to a write pulse;
address generator means for receiving initial address data from said microcomputer section, and for generating address data based on said initial address data, the generated address data being used for defining an initial writing location of said write data in said memory;
address changing means, coupled to said address generator means, for changing the generated address data generated by said address generator means to form changed address data which is successive with respect to said display area of said compressed-coded character data, and for transferring the changed address data to said memory in response to a transfer pulse;
write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a free memory access period is allocated within one write cycle period of said compressed-coded character data packets; and
writing-number detection means, coupled to said write-enable means and to receive predetermined data indicating a successive length of said write data to be displayed, and responsive to said predetermined data indicating a successive length of the write data to be displayed, for detecting a number of repetitions of successive writing in said memory of a same data, and stopping the writing of said same data when the detected number of repetitions corresponds to said predetermined data;
pulse generating means, coupled said write-enable means, for generating a first pulse indicating a start of said free memory access period, and a second pulse indicating an end of said free memory access period;
wherein leading and trailing edges of said transfer pulse are determined based on said first and second pulses, respectively, and said memory access period is defined between said leading and trailing edges of said transfer pulse;

wherein said write-enable means includes:

access-control means for generating said transfer pulse, said leading edge of said transfer pulse substantially matching a leading edge of said first pulse and said trailing edge of said transfer pulse substantially matches a trailing edge of said second pulse.

6. A processor according to claim 5, wherein said write-enable means further includes:

pulse generator means for generating said write pulse when said transfer pulse is generated.

7. A processor according to claim 1, wherein said address changing means includes:

write-address register means, coupled to said address generator means, for storing said initial address data, and for providing internal write-address data which corresponds to the combination of said initial address data and the number of repetitions of said successive same-data writing; and write gate means, coupled to said write-address register means and said memory, and being responsive to said transfer pulse, for passing said internal write-address data, and supplying the passed internal write-address data, as said address data, to said memory, when said transfer pulse is generated.

8. A processor according to claim 7, wherein said write-address register means includes:

a first write-address register for storing horizontal write-address data, which indicates an address of said character data with respect to a horizontal direction of the display area; and a second write-address register for storing vertical write-address data, which indicates an address of said character data with respect to a vertical direction of the display area.

9. A data processor for performing repetitive same-data processing on character data packets intended to be displayed at horizontally or vertically successive display locations, and supplied externally to the data processor, comprising:

a microcomputer section,
a memory means for storing read and write data, and
a data processing unit which includes:

(a) data register means for receiving write data to be stored in said memory means from said microcomputer section, and for transferring said write data to said memory means in response to a write pulse;

(b) address generator means for receiving initial address data from said microcomputer section, and for generating address data based on said initial address data, the generated address data being used for defining a writing location of said write data in said memory means;

(c) address changing means, coupled to said address generator means, for changing the generated address data generated by said address generator means to form changed address data, the changed address data being successive with respect to a storage area of said character data which corresponds to said horizontally or vertically successive display locations, and for transferring the changed address data to said memory means, in response to a transfer pulse;

means for determining a free memory access period during which data is not being read from said memory to be displayed;

(e) write-enable means, coupled to said address changing means and said data register means, for generating said transfer pulse to said address changing means to supply said changed address data to said memory means for each writing of the same write data and for generating said write pulse to said data register means, so that said same write data is repeatedly written in said memory means in accordance with said changed address data during said free memory access period; and (f) writing-number detection means, coupled to said write-enable means, and responsive to prescribed data indicating a successive length of the character data to be displayed, for detecting a number of repetitions of successive writing in said memory of a same data, and stopping the writing of said same data when the detected number of repetitions corresponds to said prescribed data.

10. A processor according to claim 9, wherein said writing-number detection means (e) of said data processing unit includes:

counter means, coupled to said microcomputer section and said write-enable means, connected to receive said prescribed data from said microcomputer section, for counting a number of repetitions of said successive same-data writing, generating a detection signal indicating an end of the repetitive same-data writing when the number of the counting reaches a value corresponding to said prescribed data, and supplying said detection signal to said write-enable means, so that the generation of said write pulse is stopped.

11. A processor according to claim 10, wherein said data processing unit further comprises:

(f) pulse generating means, coupled to said write-enable means, for generating a first pulse indicating a start of said memory access period, and a second pulse indicating an end of said memory access period.

12. A data processor for performing repetitive same-data processing on character data packets supplied externally to the data processor, comprising:

a microcomputer section,
memory means for storing read and write data, and
a data processing unit which includes:

(a) data register means for storing write data to be written in said memory means and supplied from said microcomputer section, and for transferring the stored write data to said memory means in response to a write pulse;

(b) address generator means for receiving initial address data from said microcomputer section, and for generating address data based on said initial address data, the generated address being used for defining a writing location of said write data in said memory means;

(c) address changing means, coupled to said address generator means, for changing the generated address data generated by said address generator means to form changed address data, the changed address data being successive with respect to a display area of said character data, and for transferring the changed address data to said memory means, in response to a transfer pulse;

(d) write-enable means, coupled to said address changing means and said data register means, for generating said transfer pulse to said address changing means to supply said changed address data to said memory means for each writing of the same write data and for generating said write pulse to said data register means, so that said same write data is repeatedly written in said memory means in accordance with said changed address data during a memory access period which is allocated within one write cycle period of said character data packets;

(e) writing-number detection means, coupled to said write-enable means, and responsive to prescribed data indicating a successive length of the character data to be displayed, for detecting a number of repetitions of successive writing in said memory of a same data, and stopping the writing of said same data when the detected number of repetitions corresponds to said prescribed data;

said writing-number detection means including:

counter means, coupled to said microcomputer section and said write-enable means, connected to receive said prescribed data from said microcomputer section, for counting a number of repetitions of said successive same-data writing, generating a detection signal indicating an end of the repetitive same-data writing when a number of the counting reaches a value corresponding to said prescribed data, and supplying said detection signal to said write-enable means to stop the generation of said write pulse; and (f) pulse generating means, coupled to said write-enable means, for generating a first pulse indicating a start of said memory access period, and a second pulse indicating an end of said memory access period;

wherein leading and trailing edges of said transfer pulse are determined based on said first and second pulses, respectively, and said memory access period is defined between said leading and trailing edges of said transfer pulse.

13. A processor according to claim 12, wherein said write-enable means includes:

access-control means for generating said transfer pulse, said leading edge of said transfer pulse substantially matching a leading edge of said first pulse and said trailing edge of said transfer pulse substantially matches a trailing edge of said second pulse.

14. A processor according to claim 13, wherein said write-enable means further includes:

pulse generator means for generating said write pulse when said transfer pulse is generated.

15. A processor according to claim 10, wherein said address changing means includes:

write-address register means, coupled to said address generator means, for storing said initial address data, and for providing internal write-address data which corresponds to the combination of said initial address data and the number of repetition of said successive same-data writing; and write gate means, coupled to said write-address register means and said memory, and being responsive to said transfer pulse, for passing said internal write-address data, and supplying the passed internal write-address data, as said address data, to said memory means, when said transfer pulse is generated.

16. A processor according to claim 15, wherein said write-address register means includes:

a first write-address register for storing horizontal write-address data, which indicates an address of said character data with respect to a horizontal direction of the display area; and a second write-address register for storing vertical write-address data, which indicates an address of said character data with respect to a vertical direction of the display area.

17. A data processor for processing compressed-coded data packets supplied externally to the data processor, said data processor including a microcomputer section, a data processing unit, and a read/write memory, said data processing unit comprising:

data register means for storing write data to be written into said memory and supplied from said microcomputer section, and for transferring the stored write data to said memory in response to a write pulse;

address generator means for receiving initial address data from said microcomputer section, and for generating address data based on said initial address data, the generated address being used for defining an initial writing location of said write data in said memory;

address changing means, coupled to said address generator means, for changing the generated address data generated by said generator means to form changed address data which is successive with respect to a display area of said compressed-coded data, and for transferring the changed address data to said memory, in response to a transfer pulse;

write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a memory access period which is allocated within one write cycle period of said compressed-coded data packets;

writing-number detection means, coupled to said write-enable means, and responsive to said prescribed data indicating a successive length of the write data to be displayed, for detecting a number of repetitions of successive writing in said memory of a same data, and stopping the writing of said same data when the detected number of repetitions corresponds to said prescribed data; and pulse generating means, coupled to said write-enable means, for generating a first pulse indicating a start of said memory access period, and a second pulse indicating an end of said memory access period;

wherein leading and trailing edges of said transfer pulse are determined based on said first and second pulses respectively, and said memory access period is defined by said leading and trailing edges of said transfer pulse.

18. A processor according to claim 17, wherein said writing-number detection means includes:

counter means, coupled to said microcomputer section and said write-enable means, connected to receive said prescribed data from said microcomputer section, for counting a number of repetition of said successive same-data writing, generating a detection signal indicating the end of the repetitive same-data writing when the number of the counting reaches a value corresponding to said prescribed data, and supplying said detection signal to said write-enable means, so that the generation of said write pulse is stopped.

19. A processor according to claim 17, wherein said write-enable means includes:

access-control means for generating said transfer pulse, said leading edge of said transfer pulse substantially matching a leading edge of said first pulse and said trailing edge of said transfer pulse substantially matches a trailing edge of said second pulse.

20. A processor according to claim 19, wherein said write-enable means further includes:

pulse generator means for generating said write pulse when said transfer pulse is generated.

21. A data processor for processing compressed-coded data packets supplied externally to the data processor, said data processor including a microcomputer section, a data processing unit, and a read/write memory, said data processing unit comprising:

data register means for storing write data to be written into said memory and supplied from said microcomputer section, and for transferring the stored write data to said memory in response to a write pulse;

address generator means for receiving initial address data from said microcomputer section, and for generating address data based on said initial address data, the generated address being used for defining an initial writing location of said write data in said memory;

address changing means, coupled to said address generator means, for changing the generated address data generated by said generator means to form changed address data which is successive with respect to a display area of said compressed-coded data, and for transferring the changed address data to said memory, in response to a transfer pulse;

write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a memory access period which is allocated within one write cycle period of said compressed-coded data packets; and writing-number detection means, coupled to said write-enable means, and responsive to said prescribed data indicating a successive length of the write data to be displayed, for detecting a number of repetitions of successive writing in said memory of a same data, and stopping the writing of said same data when the detected number of repetitions corresponds to said prescribed data;

wherein said address changing means includes:

(i) write-address register means, coupled to said address generator means, for storing said initial address data, and for providing internal write-address data which corresponds to the combination of said initial address data and the number of repetitions of said successive same-data writing; and (ii) write gate means, coupled to said write-address register means and said memory, and being responsive to said transfer pulse, for passing said internal write-address data, and supplying the passed internal write-address data, as said address data to said memory, when said transfer pulse is generated;

wherein said write-address register means includes:

(i) a first write-address register for storing horizontal write-address data, which indicates an address of said write data with respect to a horizontal direction of the display area; and (ii) a second write-address register for storing vertical write-address data, which indicates an address of said write data with respect to a vertical direction of the display area.

22. A data processor for processing compressed-coded data packets supplied externally to the data processor, said data processor including a microcomputer section, a data processing unit, and a read/write memory, said data processing unit comprising:

data register means for storing write data to be written into said memory and supplied from said microcomputer section, and for transferring the stored write data to said memory in response to a write pulse said write data corresponding to data contained in said character data packets;

address generator means for receiving initial address data from said microcomputer section, and for generating address data based on said initial address data, the generated address data being used for defining an initial writing location of said write data in said memory;

address changing means, coupled to said address generator means, for changing the generated address data generated by said generator means to form changed address data which is successive with respect to a display area of said compressed-coded data, and for transferring the changed address data to said memory, in response to a transfer pulse;

write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a memory access period which is allocated within one write cycle period of said compressed-coded data packets the number of repetitions of the same data writing depending on information in said character data packets; and writing-number detection means, coupled to said write-enable means, for detecting prescribed data, indicating a successive length of the write data to be displayed, from information in said character data packets, for maintaining said prescribed data for detecting a number of repetitions of successive writing in said memory of a same data, for comparing the detected repetition number with said prescribed data, and for stopping the writing of said same data when the detected number of repetitions corresponds to said prescribed data; and pulse generating means, coupled to said write-enable means, for generating a first pulse indicating a start of said free memory access period, and a second pulse indicating an end of said free memory access period;

wherein leading and trailing edges of said transfer pulse are determined based on said first and second pulses, respectively, and said memory access period is defined by said leading and trailing edges of said transfer pulse.

23. A data processor for processing compressed-coded data supplied externally to the data processor, said data processor including a microcomputer section, a data processing unit, and a read/write memory from-/into which data to be displayed is read/written, an address of the read/write data corresponding to a display location in a given display device, said data processing unit comprising:

data register means for storing write data to be written into said memory and supplied from said microcomputer section, and for transferring the stored write data to said memory in response to a write pulse;

address generator means for receiving initial address data from said microcomputer section, and for generating address data based on said initial address data, the generated address data being used for defining an initial writing location of said write data in said memory;

address changing means, coupled to said address generator means, for changing the generated address data generated by said generator means to form changed address data which is successive with respect to a display area and for transferring the changed address data to said memory, in response to a transfer pulse;

write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a memory access period which is obtained by time-sharing a display period for said display device;

writing-number detection means, coupled to said write-enable means, for detecting prescribed data, indicating a successive length of the write data to be displayed, from information in said character data packets, for detecting a number of repetitions of successive writing in said memory of a same data; and write stopping means, coupled to said writing number detection means and said write enable means for comparing the detected repetition number with a prescribed data indicating a successive length of the write data to be displayed, for maintaining said prescribed data, and for stopping the writing of said same data when the detected number of repetitions corresponds to said prescribed data, said write data being obtained from information in said compressed coded data;

pulse generating means, coupled to said write-enable means, for generating a first pulse indicating a start of said memory access period, and a second pulse indicating an end of said memory access period;

wherein leading and trailing edges of said transfer pulse are determined based on said first and second pulses, respectively, and said memory access period is defined by said leading and trailing edges of said transfer pulse;

24. A processor according to claim 23, wherein said write-enable means includes:

access-control means for generating said transfer pulse, said leading edge of said transfer pulse substantially matching a leading edge of said first pulse and said trailing edge of said transfer pulse substantially matching a trailing edge of said second pulse.

25. A processor according to claim 24, wherein said write-enable means further includes:

pulse generator means for generating said write pulse when said transfer pulse is generated.

26. A data processor for processing compressed-coded data supplied externally to the data processor, said data processor including a microcomputer section, a data processing unit, and a read/write memory from-/into which data to be displayed at horizontally or vertically successive display locations is read/written, an address of the read/write data corresponding to a display location in a given display device, said data processing unit comprising:

data register means for storing write data to be written into said memory and supplied from said microcomputer section, and for transferring the stored write data to said memory in response to a write pulse;

address generator means for receiving initial address data from said microcomputer section, and for generating address data based on said initial address data, the generated address being used for defining an initial writing location of said write data in said memory;

address changing means, coupled to said address generator means, for changing the generated address data generated by said address generator means to form changed address data which is successive with respect to said horizontally or vertically successive display locations, and for transferring the changed address data to said memory in response to a transfer pulse;

wherein said address changing means includes:

write-address register means, coupled to said address generator means, for storing said initial address data, and for providing internal write-address data which corresponds to the combination of said initial address data and the number of repetitions of said successive same-data writing; and write gate means, coupled to said write-address register means and said memory, and being responsive to said transfer pulse, for passing said internal write-address data, and supplying the passed internal write-address data, as said address data, to said memory, when said transfer pulse is generated;

wherein said write-address register includes:

a first write-address register for storing horizontal write-address data, which indicates an address of said write data with respect to a horizontal direction of the display area; and a second write-address register for storing vertical write-address data, which indicates an address of said write data with respect to a vertical direction of the display area;

write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a memory access period which is obtained by time-sharing a display period for said display device;

writing-number detection means, coupled to said write-enable means, for detecting prescribed data, indicating a successive length of the write data to be displayed from information in said character data packets, for detecting a number of repetitions of successive writing in said memory of a same data.

27. A data processor for processing compressed-coded data supplied externally to the data processor, said data processor including a microcomputer section, a data processing unit, and a read/write memory from/into which data to be displayed is read/written at vertically or horizontally successive display areas, an address of the read/write data corresponding to a display location in a given display device, said data processing unit comprising:

data register means for storing write data to be written into said memory and supplied from said microcomputer section, and for transferring the stored write data to said memory in response to a write pulse;

address generator means for receiving initial address data from said microcomputer section, and for generating address data based on said initial address data, the generated address being used for defining an initial writing location of said write data in said memory;

address changing means, coupled to said address generator means, for changing the generated address data generated by said address generator means to form changed address data which is successive with respect to said vertically or horizontally successive display areas, and for transferring the changed address data to said memory in response to a transfer pulse;

write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a memory access period which is obtained by time-sharing a display period for said display device;

writing-number detection means, coupled to said write-enable means, for detecting prescribed data, indicating a successive length of the write data to be displayed, from information in said character data packets, for detecting a number of repetitions of successive writing in said memory of a same data.

stopping the writing of said same data when the detected number of repetitions corresponds to said prescribed data, said write data being obtained from information in said compressed coded data.

28. A data processor according to claim 27, wherein a plurality of said memory access periods and memory read periods are alternatively arranged in a plurality of said display periods said memory read periods being provided for displaying the write data stored in said memory on said display device.

29. A data processor for processing compressed-coded data supplied externally to the data processor, said data processor including a microcomputer section, a data processing unit, and a read/write memory from/into which data to be displayed is read/written, an address of the read/written data corresponding to a display location in a given display device, said data processing unit comprising:

data register means for storing write data to be written into said memory and supplied from said microcomputer section, and for transferring the stored write data to said memory in response to a write pulse;

address generator means for receiving initial address data from said microcomputer section, and for generating address data based on said initial address data, the generated address being used for defining an initial writing location of said write data in said memory;

address changing means, coupled to said address generator means, for changing the generated address data generated by said generator means to form changed address data which is successive with respect to a display area, and for transferring the changed address data to said memory, in response to a transfer pulse;

write enable means, coupled to said address changing means and said data register means, for generating said transfer pulse to said address changing means to supply said changed address data to said memory only for each writing of the same write data and for generating said write pulse to said data register means, so that said same write data is repeatedly written in said memory in accordance with said changed address data during a memory access period which is obtained by time-sharing a display period for said display device:

writing-number detection means, coupled to said write-enable for detecting prescribed data, indicating a successive length of the write data to be displayed, from information in said character data packets, for detecting a number of repetitions of successive writing in said memory of a same data; and stopping the writing of said same data when the detected number of repetitions corresponds to said prescribed data, said write data being obtained from information in said compressed coded data;

wherein a plurality of said memory access periods and memory read periods are alternatively arranged in a plurality of said display periods, said memory read periods being provided for displaying the write data stored in said memory on said display device;

wherein said memory access periods corresponds to N-times longer than a display clock period of said display device, where N is an integer.

30. A data processor according to claim 28, wherein said memory access periods corresponds to $2_N$-times longer than a display clock period of said display device, where N is an integer.

* * * * *